United States Patent
McIntosh et al.

(10) Patent No.: US 9,294,084 B1
(45) Date of Patent: Mar. 22, 2016

(54) MULTI-STAGE SLEW RATE CONTROL PROFILING FOR TRANSISTOR DRIVE APPLICATIONS

(71) Applicant: Allegro Microsystems, LLC, Worcester, MA (US)

(72) Inventors: James McIntosh, East Lothian (GB); Robert D. Christie, Fife (GB); Colin Hall, West Linton (GB); Alistair Wood, Macbiehill (GB)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/554,396

(22) Filed: Nov. 26, 2014

(51) Int. Cl.
*H03K 3/00* (2006.01)
*H03K 17/16* (2006.01)
*H03K 17/12* (2006.01)

(52) U.S. Cl.
CPC ............ *H03K 17/165* (2013.01); *H03K 17/122* (2013.01); *H03K 17/127* (2013.01); *H03K 17/168* (2013.01)

(58) Field of Classification Search
USPC .......................... 327/108–109, 170, 427, 434
See application file for complete search history.

(56) References Cited

U.S. PATENT DOCUMENTS

| | | | |
|---|---|---|---|
| 4,540,893 A | 9/1985 | Bloomer | |
| 5,594,369 A | 1/1997 | Kondoh et al. | |
| 5,668,449 A | 9/1997 | Caroblante | |
| 5,670,894 A | 9/1997 | Takaishi et al. | |
| 6,208,177 B1 | 3/2001 | Knoedl, Jr. | |
| 6,396,250 B1 | 5/2002 | Bridge | |
| 7,936,189 B2* | 5/2011 | Tumminaro | H03K 17/163 327/108 |
| 8,692,482 B2 | 4/2014 | Szczeszynski et al. | |
| 8,773,172 B2* | 7/2014 | Bayerer | H03K 17/063 327/108 |
| 8,779,805 B1 | 7/2014 | Fernandez et al. | |
| 8,957,715 B2 | 2/2015 | Eagen | |
| 2002/0153928 A1 | 10/2002 | Zerilli et al. | |
| 2010/0156505 A1 | 6/2010 | Strzalkowski | |

FOREIGN PATENT DOCUMENTS

DE 10 2007 009 734 6/2008
JP 2003125574 4/2003

OTHER PUBLICATIONS

U.S. Appl. No. 14/620,656, filed Feb. 12, 2015, Wibben et al.
U.S. Appl. No. 14/677,029, filed Apr. 2, 2015, Martin et al.
U.S. Appl. No. 14/798,912, filed Jul. 14, 2015, Wibben.
Allegro Microsystems, LLC Data Sheet A4911; "Automotive Three Phase MOSFET Driver;" May 22, 2015; pp. 1-60.
Allegro Microsystems, LLC Data Sheet A8660; "Synchronous Buck Controller with Low Operating Current;" May 20, 2015; 30 pages.

(Continued)

*Primary Examiner* — An Luu
(74) *Attorney, Agent, or Firm* — Daly, Crowley, Mofford & Durkee LLP

(57) ABSTRACT

A transistor drive circuit uses multi-stage slew rate control to drive one or more switching transistors. After a decision is made to change transistor state, a first drive current may be applied to an input terminal of the transistor for a predetermined time duration. After the predetermined time duration, a second drive current may be applied to the input terminal. When the transition between states is substantially complete, the current drive to the input terminal may be changed to a voltage drive. In some embodiments, the predetermined time duration may be based on the start time of a Miller plateau during the transition period.

20 Claims, 6 Drawing Sheets

(56) References Cited

OTHER PUBLICATIONS

PCT International Preliminary Report on Patentability and Written Opinion of the ISA dated Jul. 9, 2015; for PCT Pat. App. No. PCT/US2013/071165; 8 pages.
US 6,441,120, 6/2002, Hung et al. (withdrawn).
U.S. Appl. No. 13/727,149; 174 pages.
Search Report and Written Opinion dated Mar. 13, 2014 for International Application No. PCT/US2013/071165; 11 pages.
Application as filed Aug. 15, 2014 U.S. Appl. No. 62/037,838; 19 pages.
Data Sheet of Allegro Mircosystems, LLC for A4933 "Automotive 3-Phase MOSFET Driver" 2010, 25 pages.
Data Sheet of STMicroelectronics for L99DZ80EP "Door Actuator Driver" Sep. 2013 68 pages.
Advanced Power Technology Application Note APT0102 Rev—Oct. 29, 2001; "Optimizing MOSFET and IGBT Gate Current to Minimize dv/dt Induced Failures in SMPS Circuits", 2001, 6 pages.
Search Report and Written Opinion dated Jan. 28, 2016 for PCT Application No. PCT/US2015/057920; 10 pages.

* cited by examiner

| | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 8:Config 8 | 0 | 1 | 0 | 0 | 0 | WR | 0 | THR3 | THR2 | THR1 | THR0 | THF3 | THF2 | THF1 | THF0 | P |
| 9:Config 9 | 0 | 1 | 0 | 0 | 1 | WR | 0 | IHR13 | IHR12 | IHR11 | IHR10 | IHF13 | IHF12 | IHF11 | IHF10 | P |
| 10:Config 10 | 0 | 1 | 0 | 1 | 0 | WR | 0 | IHR23 | IHR22 | IHR21 | IHR20 | IHF23 | IHF22 | IHF21 | IHF20 | P |
| 11:Config 11 | 0 | 1 | 0 | 1 | 1 | WR | 0 | TLR3 | TLR2 | TLR1 | TLR0 | TLF3 | TLF2 | TLF1 | TLF0 | P |
| 12:Config 12 | 0 | 1 | 1 | 0 | 0 | WR | 0 | ILR13 | ILR12 | ILR11 | ILR10 | ILF13 | ILF12 | ILF11 | ILF10 | P |
| 13:Config 13 | 0 | 1 | 1 | 0 | 1 | WR | 0 | ILR23 | ILR22 | ILR21 | ILR20 | ILF23 | ILF22 | ILF21 | ILF20 | P |

MULTI-STAGE SLEW RATE CONTROL PROFILING FOR TRANSISTOR DRIVE APPLICATIONS

FIELD

The subject matter described herein relates generally to electronic circuits and, more particularly, to circuits and techniques for driving one or more transistors.

BACKGROUND

In many transistor applications that involve switching (e.g., applications involving pulse width modulation (PWM), switching power converters, etc.), it is desirable to operate the switching circuitry in a manner that enhances the electromagnetic compatibility (EMC) performance of the underlying system. For example, in driver applications where an integrated circuit (IC) driver device is used to drive one or more external transistors to perform a particular function, it is typically desirable that the switching activity of the external transistor(s) cause as little electromagnetic interference (EMI) as possible to surrounding circuitry. It is also desirable that transitions between switching states be performed quickly with as little switching delay as possible. There is a need for techniques, circuits, and systems that are capable of achieving these goals.

SUMMARY

Techniques, circuits, and systems disclosed herein are capable of achieving enhanced EMC performance in transistor drive applications by providing novel multi-stage slew rate control. The techniques, circuits, and systems are also capable of achieving quicker transitions (i.e., less transition delay) than were previously possible in transistor drive circuits that control slew rate. During switch transitions between an "on" state and an "off" state, multiple different controlled drive currents are used. To reduce potential undesirable electromagnetic emissions, a low controlled drive current level may be provided to a transistor input terminal during a Miller plateau portion of a transition period. To decrease transition time, a higher controlled drive current level may be provided to the transistor input terminal during a period before the Miller plateau region. The higher current level may be adapted for rapid charging or discharging of an input capacitance of the transistor to quickly reach the beginning of the Miller region. The lower drive current may then be used for the duration of the Miller plateau region until the transition is substantially complete (i.e., the transistor is fully, or near fully, on or off). When the transistor is sufficiently close to the "full on" or "full off" state, the driver circuitry may change to a voltage drive on the input terminal of the transistor.

In some embodiments, multi-stage slew rate control parameter values for use during transitions are stored within control registers of a transistor drive circuit. Thus, when a state change is commanded for a driven transistor, a control unit may carry out the state change using data acquired from the control registers. In some implementations, the control registers are user-configurable (programmable). An end user of the transistor drive circuit can therefore configure the control registers based on the characteristics of the particular transistor(s) to be driven. The control registers may store data that is indicative of, for example, an initial controlled current level to apply during a turn on operation of a driven transistor, a time duration to apply the initial current during the turn on operation, a secondary controlled current level to use during the turn on operation after the time duration has expired, an initial controlled current level to apply during a turn off operation of the driven transistor, a time duration to apply the initial current level during the turn off operation, and a secondary controlled current level to use during the turn off operation after the time duration has expired. If the transistor drive circuitry is to drive multiple transistors, separate slew rate control parameter values may be stored within the registers for each individual transistor or for different groups of transistors.

In some embodiments, the techniques, circuits, and systems disclosed herein may be used to drive metal-oxide-semiconductor field effect transistors (MOSFETs). However, other types of transistors may also be driven using these techniques (e.g., insulated gate bipolar transistors (IGBT), etc.). The techniques, circuits, and systems may also be used to drive transistors in a wide variety of different applications. In one embodiment, for example, features disclosed herein are implemented in an integrated circuit (IC) driver for driving a three phase motor using PWM. For each phase of the motor, the IC drives both a high side and a low side transistor to generate the corresponding output. Many other applications are also be supported.

In accordance with one aspect of the concepts, systems, circuits, and techniques described herein, an integrated circuit comprises: (a) a transistor drive circuit to drive an input terminal of an external transistor, the transistor drive circuit having a controllable output current; (b) a voltage monitor circuit to monitor a voltage across output terminals of the external transistor; and (c) control logic coupled to the transistor drive circuit, the control logic being configured to: (i) determine when the external transistor needs to transition between an off state and an on state; and (ii) in response to a determination that the external transistor needs to transition between the off state and the on state: (1) control the transistor drive circuit to provide one current level to the input terminal of the external transistor for a first portion of a transition period; (2) control the transistor drive circuit to provide another, different current level to the input terminal of the external transistor for a second portion of the transition period; and (3) control the transistor drive circuit to switch from current drive to voltage drive in response to the voltage across the output terminals of the external transistor satisfying a predetermined condition; wherein the duration of the first portion of the transition period is designed to charge or discharge an input terminal of the external transistor to a level at or before a beginning of a Miller plateau region associated with the external transistor.

In one embodiment, the control logic is configured to: in response to a determination that the external transistor needs to transition from the off state to the on state: control the transistor drive circuit to source a first current level to the input terminal of the external transistor for a first time duration; and control the transistor drive circuit to source a second current level to the input terminal of the external transistor after the first time duration; wherein the predetermined condition includes the voltage across the output terminals of the external transistor reaching or falling below a first predetermined threshold.

In one embodiment, the first current level and the first time duration are selected to quickly charge a parasitic input capacitance of the external transistor before reaching a Miller plateau; and the second current level is selected for use during the Miller plateau.

In one embodiment, the integrated circuit further comprises user-configurable control registers to store data indicative of at least one of: the first current level, the first time duration, and the second current level associated with the external transistor to be driven, wherein the control logic is configured to acquire the data from the user-configurable control registers to effect the transition from the off state to the on state.

In one embodiment, the control logic is configured to: in response to a determination that the external transistor needs to transition from the on state to the off state: (a) control the transistor drive circuit to sink a third current level from the input terminal of the external transistor for a second time duration; and (b) control the transistor drive circuit to sink a fourth current level from the input terminal of the external transistor after the second time duration; wherein the predetermined condition includes the voltage across the output terminals of the external transistor reaching or rising above a second predetermined threshold.

In one embodiment, the third current level and the second time duration are selected to quickly discharge a parasitic input capacitance of the external transistor before reaching a Miller plateau; and the fourth current level is selected for use during the Miller plateau.

In one embodiment, the integrated circuit further comprises user-configurable control registers to store data indicative of at least one of: the third current level, the second time duration, and the fourth current level associated with the external transistor to be driven, wherein the control logic is configured to acquire the data from the user-configurable control registers to effect the transition from the on state to the off state.

In one embodiment, the external transistor is a high side transistor and the transistor drive circuit is a high side transistor drive circuit, the external high side transistor to be coupled in series with an external low side transistor; and the integrated circuit further comprises: (a) a low side transistor drive circuit to drive an input terminal of the low side transistor, the low side transistor drive circuit having a controllable output current; and (b) a second voltage monitor circuit to monitor a voltage across output terminals of the low side transistor.

In one embodiment, the control logic is configured to: (a) determine when the low side transistor needs to transition between an off state and an on state; and (b) in response to a determination that the low side transistor needs to transition between the off state and the on state: (i) control the low side transistor drive circuit to apply one current level to the input terminal of the low side transistor for a first portion of a transition period associated with the low side transistor; (ii) control the transistor drive circuit to apply another, different current level to the input terminal of the low side transistor for a second portion of the transition period of the low side transistor, and (iii) control the transistor drive circuit to switch from current drive to voltage drive for the low side transistor in response to the voltage across the output terminals of the low side transistor satisfying a predetermined condition.

In one embodiment, the integrated circuit is configured to drive transistors associated with a three phase motor, wherein the transistors associated with the three phase motor include a high side transistor and a low side transistor for each of the three phases, wherein the integrated circuit includes a high side transistor drive circuit and a low side transistor drive circuit for each of the three phases, and wherein the control logic is configured to control each of the three high side drive circuits and each of the three low side drive circuits.

In one embodiment, the integrated circuit is configured to drive at least one MOSFET having a gate terminal as an input terminal and drain and source terminals as output terminals.

In accordance with another aspect of the concepts, systems, circuits, and techniques described herein, an integrated circuit comprises: (a) a transistor drive circuit to drive an input terminal of an external transistor, the transistor drive circuit having a controllable output current; (b) control logic to control the transistor drive circuit to turn the external transistor on and off in a desired manner; and (c) user-configurable memory registers to store data indicative of at least one of the following: (i) a first current level to use during a first portion of a transition period of the external transistor from an on condition to an off condition, (ii) a time duration of the first portion of the transition period from the on condition to the off condition, (iii) a second current level to use during a second portion of the transition period from the on condition to the off condition, (iv) a third current level to use during a first portion of a transition period of the external transistor from the off condition to the on condition, (v) a time duration of the first portion of the transition period from the off condition to the on condition, and (vi) a fourth current level to use during a second portion of the transition period from the off condition to the on condition, wherein the time duration of the first portion of the transition period from the on condition to the off condition and the time duration of the first portion of the transition period from the off condition to the on condition are based, at least in part, on a start point associated with a Miller plateau effect of the external transistor, wherein the control logic is configured to use the data stored in the user-configurable memory registers to control the transistor drive circuit.

In one embodiment, the first current level and the first time duration are selected to quickly discharge an input capacitance of the external transistor before reaching a Miller plateau and the second current level is selected for use during the Miller plateau.

In one embodiment, the third current level and the second time duration are selected to quickly charge the input capacitance of the external transistor before reaching a Miller plateau and the fourth current level is selected for use during the Miller plateau.

In accordance with a still another aspect of the concepts, systems, circuits, and techniques described herein, a method for driving a transistor, comprises: (a) determining whether a transistor needs to transition between an off state and an on state; and (b) if a determination is made that the transistor needs to transition between the off state and the on state: (i) applying one current level to an input terminal of the transistor for a predetermined time duration; (ii) applying another, different current level to the input terminal of the transistor after the predetermined time duration; and (iii) changing from a current drive to a voltage drive on the input terminal of the transistor in response to a voltage across the output terminals of the transistor satisfying a predetermined condition; wherein the predetermined time duration is related to a start point of a Miller plateau effect of the transistor.

In one embodiment, if the determination is a determination that the transistor needs to transition from the off state to the on state: (a) applying one current level includes providing a first current level to an input terminal of the transistor for a first time duration; (b) applying another, different current level includes providing a second current level to the input terminal of the transistor after the first time duration; and (c) the predetermined condition includes the voltage across the output terminals of the external transistor reaching or falling below a first predetermined threshold.

In one embodiment, the first current level and the first time duration are selected to quickly charge an input capacitance of the transistor before reaching a Miller plateau of the transition from the off state to the on state; and the second current level is selected for use during the Miller plateau of the transition from the off state to the on state.

In one embodiment, if the determination is a determination that the transistor needs to transition from the on state to the off state: (a) applying one current level includes drawing a third current level from the input terminal of the transistor for a second time duration; (b) applying another, different current level includes drawing a fourth current level from the input terminal of the transistor after the second time duration; and (c) the predetermined condition includes the voltage across the output terminals of the external transistor reaching or rising above a second predetermined threshold.

In one embodiment, the third current level and the second time duration are selected to quickly discharge the input capacitance of the transistor before reaching a Miller plateau of the transition from the on state to the off state; and the fourth current level is selected for use during the Miller plateau of the transition from the on state to the off state.

In one embodiment, the method further comprises reading data indicative of at least one of: the one current level, the other different current level, and the predetermined time duration from a memory before applying the one current level.

BRIEF DESCRIPTION OF THE DRAWINGS

The foregoing features may be more fully understood from the following description of the drawings in which:

FIG. 4 is a diagram illustrating exemplary content designations for a number of configuration registers associated with a transistor driver circuit in accordance with an embodiment.

DETAILED DESCRIPTION

Figure 1:
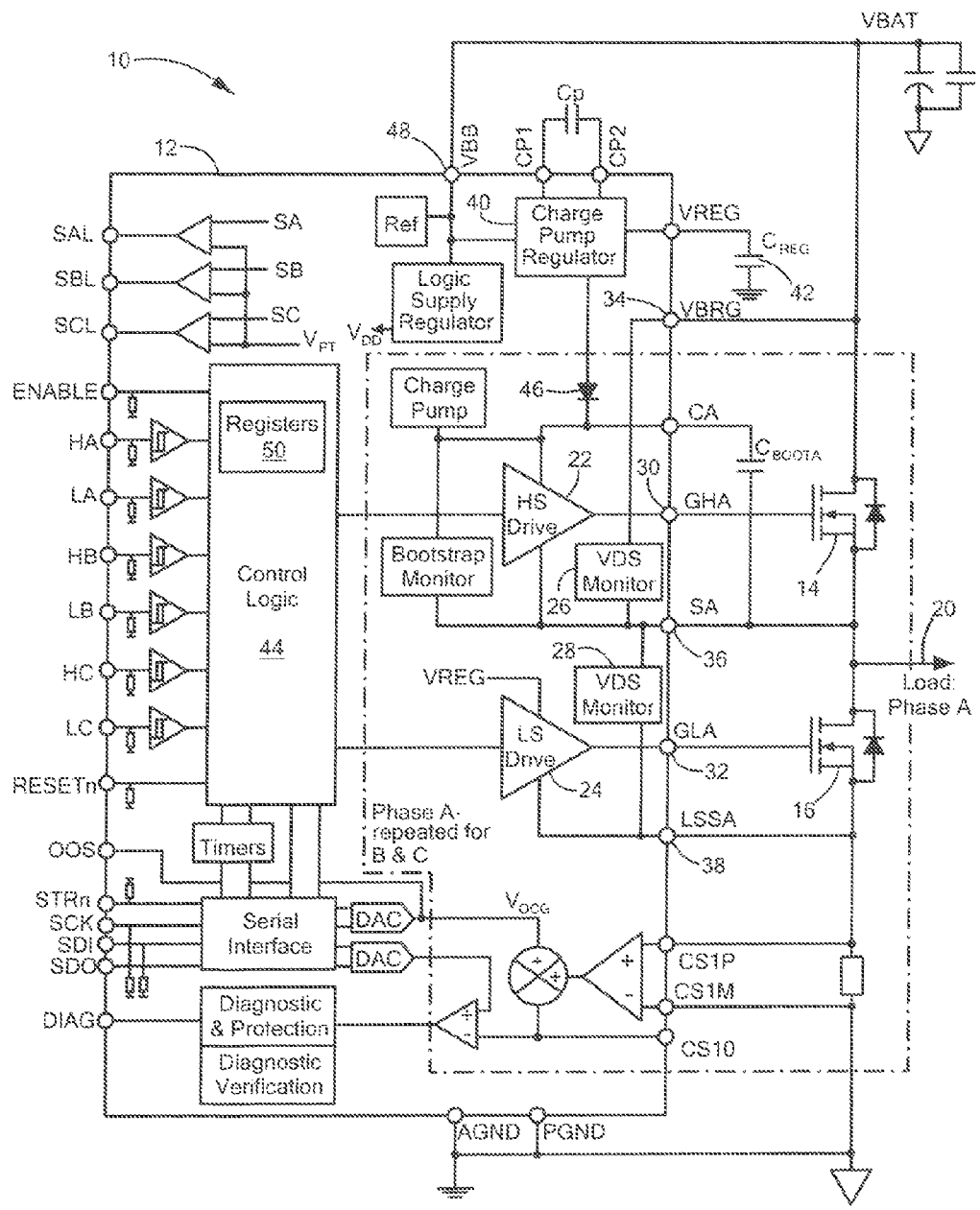
FIG. 1 is a schematic diagram illustrating an exemplary system for use in driving a three phase motor in accordance with an embodiment.

FIG. 1 is a schematic diagram illustrating an exemplary system 10 for use in driving a three phase motor in accordance with an embodiment. As will be described in greater detail, the system 10 incorporates features of the transistor drive techniques and circuits of the present disclosure. As illustrated, the system 10 includes an integrated circuit (IC) 12 having a plurality of input-output terminals shown as small circles along an edge of the IC 12. The IC 12 drives external transistors which, in turn, generate input signals for the phases of a three phase motor. To simplify illustration, FIG. 1 only shows circuitry for one of the three phases of the motor. This circuitry may be replicated multiple times in an actual circuit.

As shown in FIG. 1, the IC 12 drives an external high side (HS) transistor 14 and an external low side (IS) transistor 16 to generate an input signal for a first phase (Phase A) of the three phase motor (not shown). The HS transistor 14 and the LS transistor 16 are coupled to one another in series between two supply potentials (e.g., VBAT and ground in the illustrated embodiment). As depicted, the HS transistor 14 and the LS transistor 16 are each MOSFETS having corresponding gate, source, and drain terminals. Other types of transistors may be driven in other implementations. During operation, the HS transistor 14 and the LS transistor 16 may act as switching transistors, turning on and off in response to input signals received from the IC 12. An output node 20 located between the HS transistor 14 and the LS transistor 16 carries the input signal for the first phase of the motor. In some implementations, pulse width modulation (PWM) may be used to generate input signals for the different phases of the motor.

In power MOSFETs and other high power switching devices, a phenomena known as the Miller plateau effect is often observed during transitions between off and on states. The Miller effect typically manifests itself as a flattening of the gate-to-source voltage ($V_{GS}$) (i.e., a plateau) during a portion of the transition period. The Miller effect is caused by changes in one or more parasitic capacitances of the transistor during the transition between states. That is, at some point during the transition, a parasitic capacitance of the transistor begins to change in value in a manner that temporarily slows down or ceases the increase (or decrease) in gate voltage, which appears as a plateau on the $V_{GS}$ versus time plot.

With reference to FIG. 1, the IC 12 may include: a high side (HS) drive circuit 22, a low side (LS) drive circuit 24, a HS VDS monitor 26, a LS VDS monitor 28, a charge pump regulator 40, a regulator capacitor ($C_{REG}$) 42, and control logic 44. The HS drive circuit 22 and the LS drive circuit 24 are operative for driving gate terminals of the HS transistor 14 and the IS transistor 16, respectively. As such, an output of the HS drive circuit 22 is coupled to the gate terminal of the HS transistor 14 via a GHA pin 30 of the IC 12 and an output of the LS drive circuit 24 is coupled to the gate terminal of the LS transistor 16 via a GLA pin 32 of the IC 12. The HS drive circuit 22 and the LS drive circuit 24 may each have a controllable output current level.

The HS VDS monitor 26 is operative for monitoring the drain to source voltage ($V_{DS}$) of the HS transistor 14 and the LS VDS monitor 28 is operative for monitoring the drain to source voltage of the LS transistor 16. In the illustrated embodiment, the HS VDS monitor 26 is coupled to the drain and source terminals of the HS transistor 14 via a VBRG pin 34 and an SA pin 36, respectively. Also, the LS VDS monitor 28 is coupled to the drain and source terminals of the IS transistor 16 via the SA pin 36 and an LSSA pin 38, respectively.

The control logic 44 is operative for, among other things, controlling the operation of the HS drive circuit 22 and the LS drive circuit 24 to drive the HS transistor 14 and the LS transistor 16 in a manner that supports operation of the 3-phase motor. As such, the control logic 44 is coupled to input terminals of the HS drive circuit 22 and the LS drive circuit 24 associated with phase A of the motor. Although not shown, the control logic 44 also controls the operation of an HS drive circuit and an LS drive circuit associated with each of the other two phases of the motor.

In various embodiments, the control logic 44 may include digital logic circuitry to perform the various control functions. This may include, for example, combinational or sequential logic circuitry. In at least one embodiment, semi-custom application specific logic is used. In some embodiments, the control logic 44 may include one or more digital processing devices such as, for example, a general purpose microprocessor, a digital signal processor (DSP), a reduced instruction set computer (RISC), a complex instruction set computer (CISC), a microcontroller, and/or others. Reconfigurable hardware (FPGAs, PLAs, etc) may also be used in some implementations. Although not shown, one or more digital storage devices may also be included within the IC 12.

The HS drive circuit 22 and the LS drive circuit 24 may each have a controllable output current. In this manner, the control logic 44 is able to control the current levels that are applied to the input terminals of the HS transistor 14 and the LS transistor 16, respectively. In at least one embodiment, the HS drive circuit 22 and the LS drive circuit 24 each include a variable current source to provide the controlled output current. Other types of circuitry capable of providing a controlled output current may alternatively be used.

The charge pump regulator 40 is coupled to supply potential VBAT via pin 48 of the IC 12. The charge pump regulator 40 is operative for maintaining a regulated voltage VREG on the regulator capacitor ($C_{REG}$) 42. As shown, the regulated voltage VREG is coupled to a supply terminal of the LS drive circuit 24. Another output of the charge pump regulator 40 is coupled to a supply terminal of the HS drive circuit 22, via a diode 46.

The control logic 44 receives a number of control inputs (e.g., HA, HB, HC, LA, LB, LC, etc.) from an external control unit (e.g., a digital signal processor, a microcontroller, etc.). Among other things, these inputs indicate when the HS transistor and the LS transistor associated with each phase (A, B, C) of the motor are to change states. The control logic 44 uses this input information to determine how to control the HS drive circuit 22 and the LS drive circuit 24. When one of the driven transistors is to change state, the control logic 44 may carry out the state change using a multiple stage slew rate control approach. For example, if it is determined from the input control information that the HS transistor 14 needs to change state, the control logic 44 may control the HS drive circuit 22 to drive the gate of the HS transistor 14 using a first controlled current level for a first portion of a transition period and a second, different controlled current level for a second portion of the transition period. When the transition is complete, or near complete, the control logic 44 may then cause the HS drive circuit 22 to switch to a voltage drive on the gate of the HS transistor 14.

In some embodiments, the timing of the change between drive current levels during the transition between on and off states is based upon the timing of the Miller plateau region of the driven transistor. That is, the first current level is applied for a portion of the transition period up to, or slightly before, the start (or estimated start) of the Miller plateau. The second current level is applied during the Miller plateau. Because there is a higher risk of undesired electromagnetic emission generation during the Miller plateau region, a lower controlled current value may be used during this region. However, a higher current level may be used before the start of the Miller region to quickly charge (or discharge) the input capacitance of the driven transistor. By using this higher current level before the Miller region is reached, the total duration of the transition region can be reduced as compared to systems that utilize the same low current value throughout an entire transition period.

As shown in FIG. 1, in some embodiments, the control logic 44 may include, or have access to, a number of memory registers 50 for use in storing information defining how the control logic 44 is to control the transitions of the external transistors being driven. For example, the registers 50 may include data indicative of one or more of: a first current level to use during a transition from off to on for a high side transistor, a first time duration to apply the first current level, a second current level to use during a transition from off to on for a high side transistor after the first time duration has expired, a third current level to use during a transition from on to off for a high side transistor, a second time duration to apply the third current level, a fourth current level to use during a transition from on to off for a high side transistor after the second time duration has expired, a fifth current level to use during a transition from off to on for a low side transistor, a third time duration to apply the fifth current level, a sixth current level to use during a transition from off to on for a low side transistor after the third time duration has expired, a seventh current level to use during a transition from on to off for a low side transistor, a fourth time duration to apply the seventh current level, and an eighth current level to use during a transition from on to off for a low side transistor after the fourth time duration has expired. As used herein, the phrase "memory registers" is broadly defined to encompass all forms of memory and digital storage capable of storing data in specific addressable locations.

The data stored within the registers 50 may, in some implementations, be user configurable. This allows an end user to use the IC 12 with a wide variety of different external transistors. The end user can modify some or all of the information stored within the registers 50 based on the characteristics of the transistors being used. For example, an end user could decide to use a particular MOSFET device as a high side transistor. The end user could then determine how much charge has to be delivered to the gate terminal of the particular MOSFET before the Miller region is reached during a transition from off to on. The user may then determine a current value and time duration that will provide that level of charge (or slightly less than that level of charge) to the gate terminal to bring the transistor to a point just before the Miller transition region begins. The user may then select a current level to use during the Miller region that has a low likelihood of generating undesirable electromagnetic emissions. The end user may then repeat the above for a transition from on to off. The same procedure may then be used to generate values for the low side transistors. The generated values may then be stored within the registers 50 for use during subsequent motor drive operations. The values generated by the end user may be based upon transistor manufacturer specifications, by direct measurement of the selected transistors, or a combination of both.

In some embodiments, different values may be used for the high side transistors than are used for the low side transistors. Also, in some embodiments, different values may be used for an off to on transition of a particular transistor than are used for the on to off transition of the same transistor. In a system that uses multiple high side transistors, the same transistor design may be used for all high side transistors. Thus, the same transition parameters values may be used for all high side transistors (i.e., the same initial current, duration, and subsequent current for off to on transitions and the same initial current, duration, and subsequent current for on to off transitions). Similarly, in a system that uses multiple low side transistors, the same transistor design may be used for all low side transistors and the same transition values may be used for all low side transistors. In some embodiments, however, different transition values may be stored for each transistor being driven (e.g., different values for different high side transistors, etc.).

During operation, the control logic 44 may monitor the control inputs HA, HB, HC, LA, LB, LC to determine whether a particular driven transistor is to transition between an on state and an off state. For example, for phase A, if HA is low and LA is high, this may signify that the HS transistor 14 is to be off and the LS transistor 16 is to be on, thus the output terminal 20 is to be logic low. If HA is high and LA is low, this may signify that the HS transistor 14 is to be on and the LS transistor 16 is to be off, thus the output terminal 20 is to be logic high. If HA and LA are both low, this may signify that both the HS transistor 14 and the IS transistor 16 are to be off and the output terminal 20 is to be at a high impedance. Similarly, if HA and LA are both high, this may also signify that both the HS transistor 14 and the IS transistor 16 are to be off and the output terminal 20 is to be at a high impedance. The control logic 44 may use the above rules to determine when either the HS transistor 14 or the LS transistor 16 is to change state. The same or similar rules may apply to the other phases.

If it is determined that, for example, the HS transistor 14 is to transition from the on state to the off state, the control logic 44 may use transition values from the registers 50 to turn off the HS transistor 14. The control logic 44 may then cause the HS drive circuit 22 to sink a particular current level from the gate terminal of the HS transistor 14 for a predetermined time period read from the registers 50. After the predetermined period expires, the control logic 44 may cause the HS drive circuit 22 to sink a different current level from the gate terminal of the HS transistor 14. While this different current level is being drawn from the gate terminal, the control logic 44 may monitor the drain to source voltage of the HS transistor 14 to determine when the transistor 14 is off or nearly off. The control logic 44 may consult the HS VDS monitor 26 (or data derived therefrom) to determine the current state of the HS transistor 14 in some embodiments.

As described above, in some embodiments, the controlled drive current level applied to the input terminal of a transistor will change from one level to another during a state transition at a time based on the beginning of a Miller plateau region. It should be appreciated, however, that the current level does not have to switch at the exact beginning of the Miller region. For example, in some embodiments, the system will be designed to switch the current level slightly before the beginning (or estimated beginning) of the Miller region. This approach will still result in an enhanced transition time while ensuring that EMI will not be generated during the Miller plateau.

Figure 2A:
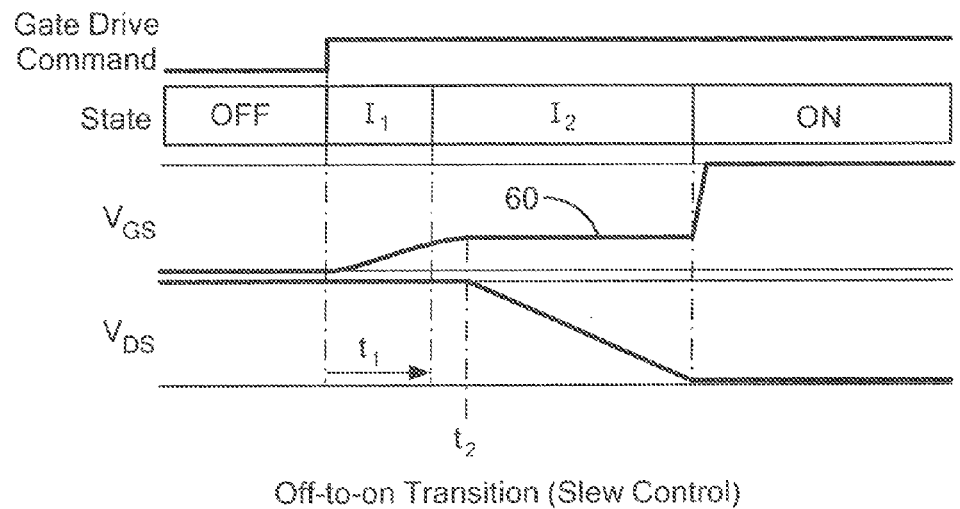
FIG. 2a is a timing diagram illustrating an exemplary off to on transition of a driven MOSFET in accordance with an embodiment.

FIG. 2a is a timing diagram illustrating an exemplary off to on transition of a driven MOSFET in accordance with an embodiment. The timing diagram includes a gate drive command waveform, a transistor state indication, a gate to source voltage ($V_{GS}$) waveform, and a drain to source voltage ($V_{DS}$) waveform. The gate drive command waveform transitions from a logic low to a logic high value as an indication that the driven transistor needs to be turned on. As shown in FIG. 2a, before the gate drive command waveform turns high, $V_{GS}$ is at or near a minimum value (e.g., ground potential) and $V_{DS}$ is at or near a maximum value (e.g., a supply potential). In response to the "turn on" indication, a first current level $I_1$ is provided to the gate terminal of the driven transistor for a time duration $t_1$. During this time period, the input capacitance of the driven transistor quickly charges and the gate voltage increases to an intermediate level. As shown, the time duration $t_1$ ends before the start of a Miller plateau region 60 at time $t_2$. At the end of the time duration $t_1$, the current level applied to the gate terminal changes to $I_2$, which has a lower magnitude than $I_1$. This lower current level is maintained through the Miller region 60 and $V_{DS}$ drops as the transistor turns on. When the transistor becomes fully on (or is sufficiently close to being fully on), the current drive on the gate changes to a voltage drive to hold the MOSFET in the on state. This may occur, for example, when $V_{DS}$ drops below a particular threshold value (e.g., 1 volt).

Figure 2B:
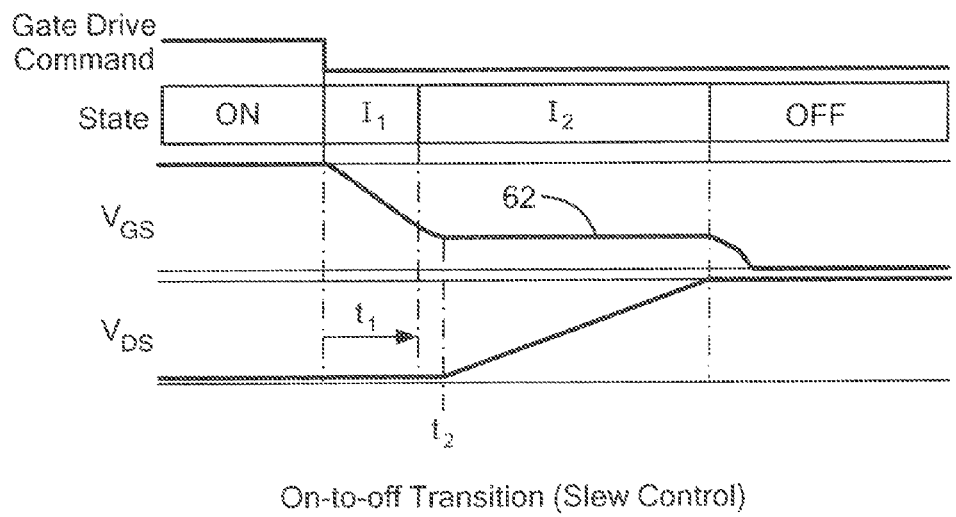
FIG. 2b is a timing diagram illustrating an exemplary on to off transition of a driven MOSFET in accordance with an embodiment.

FIG. 2b is a timing diagram illustrating an exemplary on to off transition of a driven MOSFET in accordance with an embodiment. As before, the timing diagram includes a gate drive command waveform, a transistor state indication, a gate to source voltage ($V_{GS}$) waveform, and a drain to source voltage ($V_{DS}$) waveform. The gate drive command waveform transitions from a logic high to a logic low value as an indication that the driven transistor needs to be turned off. As shown in FIG. 2b, before the gate drive command waveform turns low, $V_{GS}$ is at or near a maximum value (e.g., a supply potential) and $V_{DS}$ is at or near a minimum value (e.g., a ground potential). In response to the "turn off" indication, a first current level $I_1$ is drawn from the gate terminal of the driven transistor for a time duration $t_1$. During this time period, the input capacitance of the driven transistor quickly discharges and the gate voltage decreases to an intermediate level. As shown, the time duration $t_1$ ends before the start of a Miller plateau region 62 at time $t_2$. At the end of the time duration $t_1$, the current level drawn from the gate terminal changes to $I_2$, which has a lower magnitude than $I_1$. This lower magnitude current level is maintained through the Miller region 62 and $V_{DS}$ increases as the transistor turns off. When the transistor becomes fully off (or is sufficiently close to being fully off), the current drive on the gate changes to a voltage drive to hold the MOSFET in the off state. This may occur, for example, when $V_{DS}$ rises above a particular threshold value.

Figure 3A:
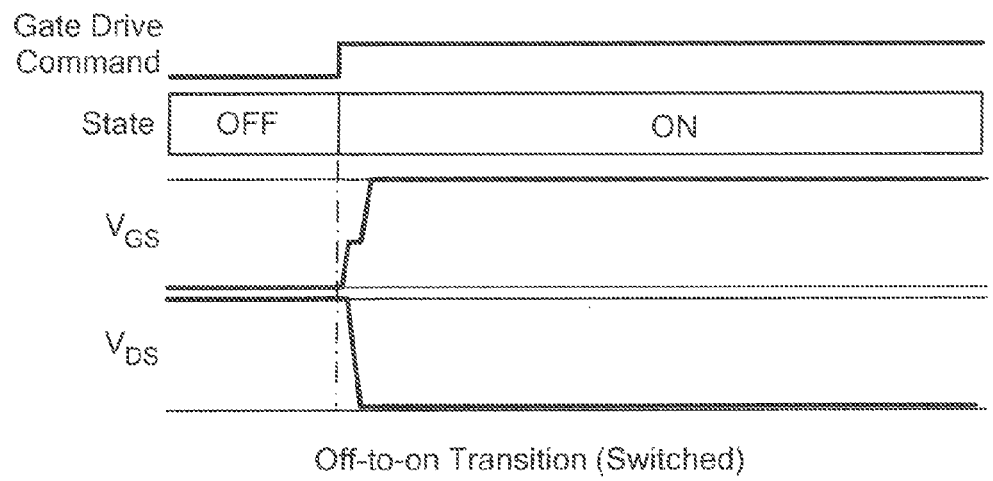
FIG. 3a is a timing diagram illustrating an exemplary scenario where a driver applies maximum drive to an input terminal of a transistor during an "off to on" transition without using slew rate control.
Figure 3B:
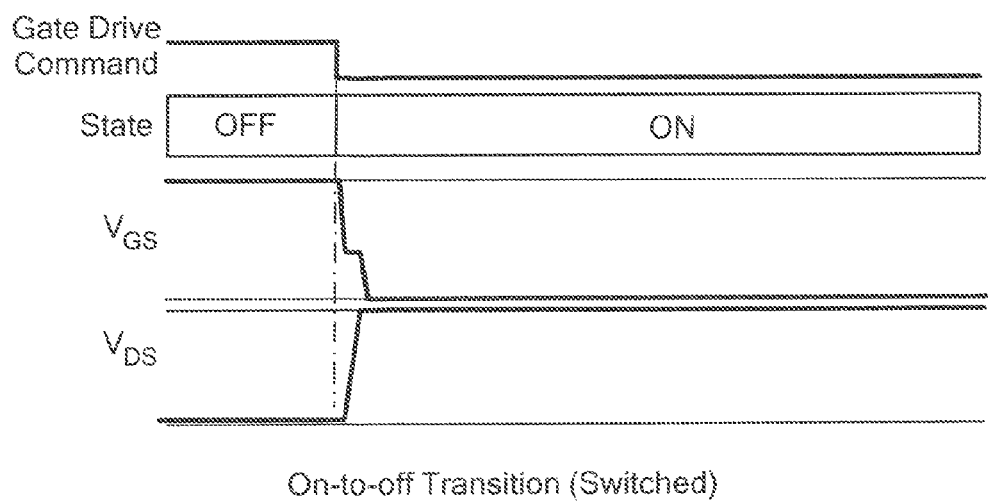
FIG. 3b is a timing diagram illustrating an exemplary scenario where a driver applies maximum drive to an input terminal of a transistor during an "on to off" transition without using slew rate control.

In the examples illustrated in FIGS. 2a and 2b above, the values of $I_1$, $I_2$, and $t_1$ may be read from local registers in order to perform the corresponding transitions. In addition, as described previously, in some embodiments, these values may be user configurable. In some embodiments, a driver circuit may be configured so that certain default data values stored within the local registers will cause the driver to apply maximum drive to cause the MOSFET to change state as quickly as possible without slew rate control. For example, in one exemplary implementation, if the data values for $I_1$, $I_2$, and $t_1$ stored in a local register for an off to on transition are all logic zeros, the driver circuit (e.g., control logic 44 of FIG. 1) may respond by instantly applying voltage drive to the gate terminal of the transistor when a turn on indication is received. This scenario is illustrated in FIG. 3a. A similar scenario is illustrated in FIG. 3b for an on to off transition.

FIG. 4 is a diagram illustrating exemplary content designations for a number of local configuration registers 70 associated with a transistor driver circuit in accordance with an embodiment. The registers 70 may be located within, for example, IC 12 of FIG. 1 or in other driver circuits. In the illustrated embodiment, six different configuration registers are provided (configuration register 8 through configuration register 13) for use in supporting multi-stage slew rate control, with each register capable of storing for 16 binary bits. As will be appreciated, other register configurations may alternatively be used. Each register includes a parity bit P to ensure that an odd number of ones in a corresponding serial transfer. Configuration register 8 includes 4 bit locations to store a time duration value (THR[3:0]) for turn on transitions of a high side transistor and 4 bit storage locations to store a time duration value (THF[3:0]) for turn off transitions of a high side transistor. Configuration register 9 includes 4 bit locations to store an initial current value (IHR1[3:0]) for turn on transitions of a high side transistor and 4 bit storage locations to store an initial current value (IHF1[3:0]) for turn off transitions of a high side transistor. Configuration register 10 includes 4 bit locations to store a secondary current value (IHR2[3:0]) for turn on transitions of a high side transistor and 4 bit storage locations to store a secondary current value (IHF2[3:0]) for turn off transitions of a high side transistor.

Configuration register 11 includes 4 bit locations to store a time duration value (TLR[3:0]) for turn on transitions of a low side transistor and 4 bit storage locations to store a time duration value (TLF[3:0]) for turn off transitions of a low side transistor. Configuration register 12 includes 4 bit locations to store an initial current value (ILR1[3:0]) for turn on transitions of a low side transistor and 4 bit storage locations to store an initial current value (ILF1[3:0]) for turn off transitions of a low side transistor. Configuration register 13 includes 4 bit locations to store a secondary current value (ILR2[3:0]) for turn on transitions of a low side transistor and 4 bit storage locations to store a secondary current value (ILF2[3:0]) for turn off transitions of a low side transistor.

For each of the four bit time duration values in registers 8 and 11, the actual time duration to use may be calculated as follows:

$$t_1 = (n+1) \times 50 \text{ nanoseconds (ns)}$$

where n is a positive integer defined by the corresponding stored binary value. Thus, the time duration value can range between 50 ns and 800 ns. For each of the four bit current values associated with off to on transitions stored in registers 9, 10, 12, and 13, the actual current value to use may be calculated as follows:

$$I = n \times 2 \text{ milliamps (mA)}$$

where n is a positive integer defined by the corresponding stored binary value. Thus, the current value may range between 2 mA and 30 mA. For each of the four bit current values associated with on to off transitions stored in registers 9, 10, 12, and 13, the actual current value to use may be calculated as follows:

$$I = n \times -2 \text{ milliamps (mA)}$$

where n is a positive integer defined by the corresponding stored binary value. Thus, the current value may range between −2 mA and −30 mA. If the register locations associated with $I_1$ and $I_2$ of a particular transition include all zeros, then a high current capability voltage drive (e.g., a 1 Ampere switch mode, etc.) may be instantly applied to the corresponding transistor input terminal in response to a gate drive command (as shown in FIGS. 3a and 3b). In such a case, the value stored in the corresponding time duration ($t_1$) register location may be ignored.

As will be appreciated, other approaches for storing transition related values may alternatively be used. For example, different number of bits may be used to represent n for each parameter. Also, different increment/decrement values may be used to calculate the actual values in each of the above equations. Further, a different combination or arrangement of values may be stored in other implementations.

In applications where multiple high side transistors are being driven (e.g., system 10 of FIG. 1), the values of THR [3:0], THF[3:0], IHR1[3:0], IHF[3.0], IHR2[3:0], and IHF2 [3:0] in the registers 70 may be used for all high side transistors. In an alternative implementation, unique transition values may be stored for each of the high side transistors being driven. Likewise, in applications where multiple low side transistors are being driven, the values of TLR[3:0], TLF[3:0], ILR1[3:0], ILF1[3:0], ILR2[3:0], and ILF2[3:0] in the registers 70 may be used for all low side transistors. In an alternative implementation, unique transition values may be stored for each of the low side transistors being driven.

Figure 5:
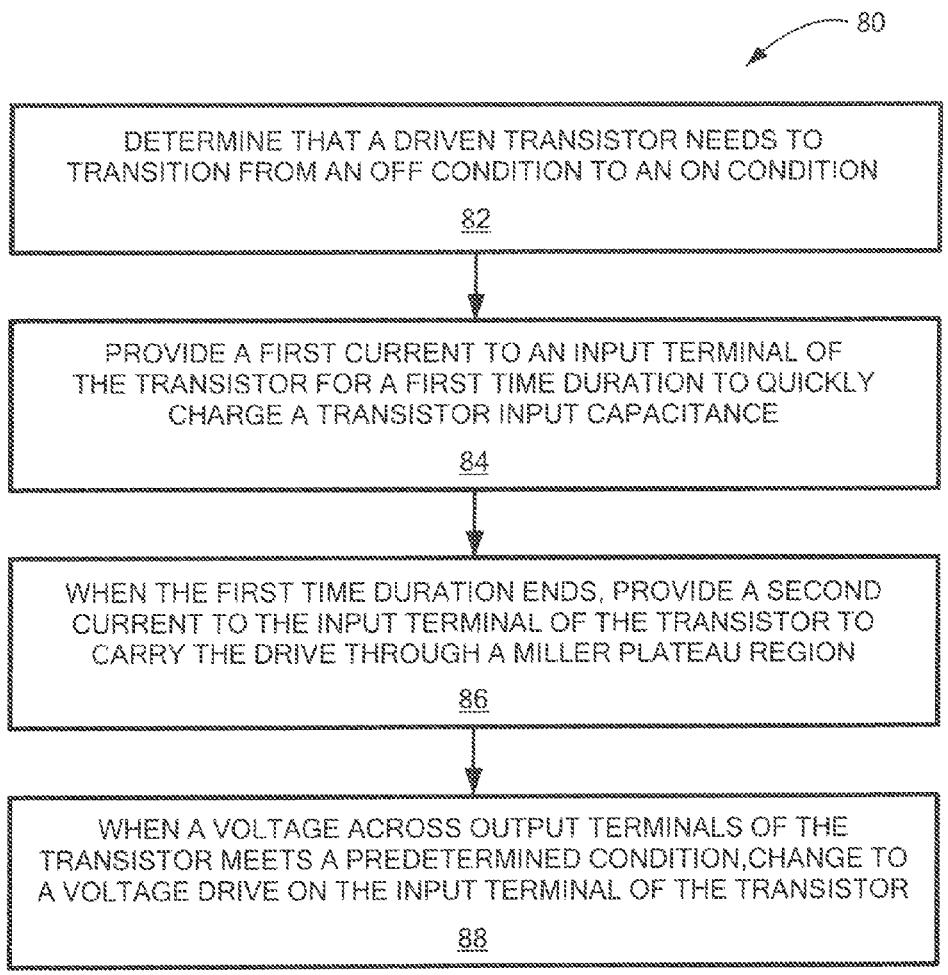
FIGS. 5 and 6 are flow diagrams illustrating exemplary processes for use in driving transistors in accordance with different embodiments.
Figure 6:
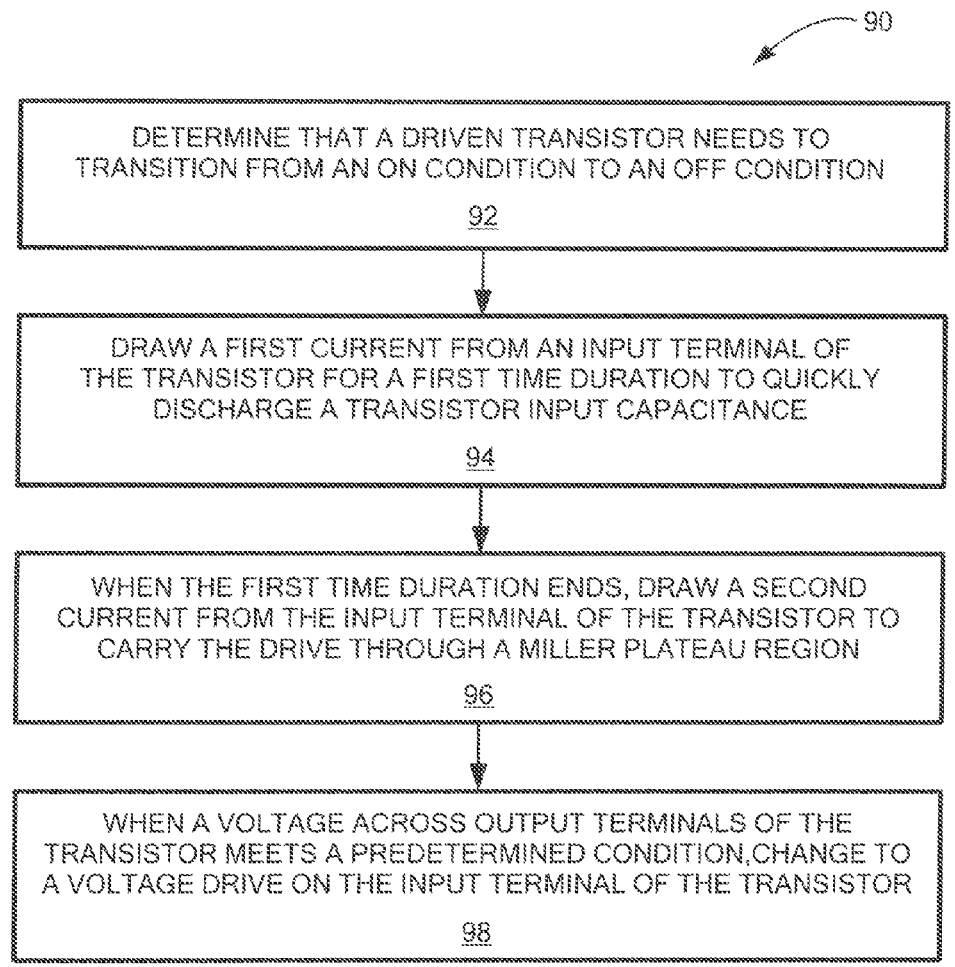

FIGS. 5 and 6 are flow diagrams illustrating exemplary processes for use in driving transistors in accordance with various embodiments.

The rectangular elements (typified by element 82 in FIG. 5) are herein denoted "processing blocks" and may represent computer software instructions or groups of instructions. It should be noted that the flow diagrams of FIGS. 5 and 6 represent exemplary embodiments of designs disclosed herein and variations in such embodiments, which generally follow the processes outlined, are considered to be within the scope of the concepts, systems and techniques described and claimed herein.

Alternatively, some or all of the processing blocks may represent operations performed by functionally equivalent circuits. Also, some processing blocks may be manually performed while other processing blocks may be performed by machine. The flow diagram does not depict the syntax of any particular programming language. Rather, the flow diagram illustrates the functional information one of ordinary skill in the art requires to fabricate circuits and/or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence described is illustrative only and can be varied without departing from the spirit of the concepts described and/or claimed herein. Thus, unless otherwise stated, the processes described below are unordered meaning that, when possible, the actions shown in the diagrams can be performed in any convenient or desirable order.

Referring now to FIG. 5, an exemplary process 80 for driving a transistor will be described. It is first determined that the transistor needs to transition from an off state to an on state (block 82). This determination may be made, for example, in response to a transition control signal. In response to the determination, a first controlled current level is provided to an input terminal of the transistor for a first time duration (block 84). In some embodiments, information indicative of the first controlled current level and the first time duration will be read from a memory before the current is applied. The first current level may be used to quickly charge an input capacitance (e.g., a parasitic capacitance) of the transistor being driven. The first time duration may be selected to end at or slightly before the start of a Miller transition region of the transistor. When the first time duration ends, a second controlled current level is provided to an input terminal of the transistor (block 86). In some embodiments, information indicative of the second controlled current level will be read from a memory before the second current level is applied. The second controlled current level may be used through the entire Miller plateau region. As such, the second controlled current level may have a lower magnitude than the first controlled current level (e.g., to reduce the likelihood of generating spurious electromagnetic emissions during the Miller region). When a voltage across the output terminals of the transistor meets a predetermined condition, the current drive on the input terminal of the transistor is changed to a voltage drive (block 88). In at least one embodiment, the predetermined condition includes the voltage achieving, or falling below, a predetermined threshold value, thus indicating that the transistor is fully on or near fully on.

With reference to FIG. 6, another exemplary process 90 for driving a transistor will be described. It is first determined that the transistor needs to transition from an on state to an off state (block 92). In response to the determination, a first controlled current level is drawn from an input terminal of the transistor for a first time duration (block 94). In some embodiments, information indicative of the first controlled current level and the first time duration will be read from a memory before the current is drawn. The first current level may be used to quickly discharge an input capacitance of the transistor. The first time duration may be selected to end at, or slightly before, the start of a Miller transition region of the transistor. When the first time duration ends, a second controlled current level is drawn from the input terminal of the transistor (block 96). In some embodiments, information indicative of the second controlled current level may be read from a memory before the second current level is drawn. The second controlled current level may be used through the entire Miller plateau region of the state transition. As such, the second controlled current level may have a lower magnitude than the first controlled current level (e.g., to reduce the likelihood of generating spurious electromagnetic emissions during the Miller region). When a voltage across the output terminals of the transistor meets a predetermined condition, the current drive on the input terminal of the transistor may be changed to a voltage drive (block 98). In at least one embodiment, the predetermined condition includes the voltage achieving, or rising above, a predetermined threshold value, thus indicating that the transistor is fully off or near fully off.

The processes of FIGS. 5 and 6 may each be performed separately or, in some embodiments, they may both be run concurrently for the same switching transistor to achieve both off to on transitions and on to off transitions for the transistor.

In at least one implementation, techniques disclosed herein (e.g., processes 80 and 90 of FIGS. 5 and 6, respectively, etc.) are implemented as computer readable instructions stored on tangible, non-transitory machine or computer readable media. This media may include, for example, magnetic data storage devices, disc based storage devices, optical storage devices, semiconductor memories, read only memories (ROMs), random access memories (RAMs), non-volatile memories, flash memories, USB drives, compact disc read only memories (CD-ROMs), DVDs, Blu-Ray disks, magneto-optical disks, erasable programmable ROMs (EPROMs), electrically erasable programmable ROMs (EEPROMs), magnetic or optical cards, and/or others. As used herein, the terms "non-transitory machine readable media," "non-transitory computer readable media," and the like are not intended to include transitory "signals per se." However, these terms are intended to cover storage media, such as volatile memory or RAM, that stores data temporarily or in a transitory fashion.

Although described herein primarily in the context of driving transistors associated with motors, it should appreciated that the features and techniques disclosed herein may be used in a wide variety of transistor drive applications. In addition, although described herein in the context of a system driving six transistors, it should be appreciated that the features and techniques disclosed herein may be used to drive any number of transistors (e.g., one or more) in different implementations. Furthermore, although described herein in the context of an integrated circuit driver, it should be appreciated that certain features and techniques disclosed herein may also be practiced in systems that do not use integrated circuitry. In the embodiments described above, a multi-stage slew rate control operation involves the application of two distinct controlled current levels during a state transition of a driven transistor. In some embodiments, however, three or more controlled current values may be used during a transition.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of this disclosure and the appended claims.

What is claimed is:

1. An integrated circuit, comprising:
  a transistor drive circuit to drive an input terminal of an external transistor, the transistor drive circuit having a controllable output current;
  a voltage monitor circuit to monitor a voltage across output terminals of the external transistor; and
  control logic coupled to the transistor drive circuit, the control logic being configured to:
    determine when the external transistor needs to transition between an off state and an on state; and
    in response to a determination that the external transistor needs to transition between the off state and the on state:
      control the transistor drive circuit to provide one current level to the input terminal of the external transistor for a first portion of a transition period;
      control the transistor drive circuit to provide another, different current level to the input terminal of the external transistor for a second portion of the transition period; and
      control the transistor drive circuit to switch from current drive to voltage drive in response to the voltage across the output terminals of the external transistor satisfying a predetermined condition;
      wherein the duration of the first portion of the transition period is designed to charge or discharge an input terminal of the external transistor to a level at or before a beginning of a Miller plateau region associated with the external transistor.

2. The integrated circuit of claim 1, wherein the control logic is configured to:
  in response to a determination that the external transistor needs to transition from the off state to the on state:
    control the transistor drive circuit to source a first current level to the input terminal of the external transistor for a first time duration; and
    control the transistor drive circuit to source a second current level to the input terminal of the external transistor after the first time duration;
  wherein the predetermined condition includes the voltage across the output terminals of the external transistor reaching or falling below a first predetermined threshold.

3. The integrated circuit of claim 2, wherein:
  the first current level and the first time duration are selected to quickly charge a parasitic input capacitance of the external transistor before reaching a Miller plateau; and
  the second current level is selected for use during the Miller plateau.

4. The integrated circuit of claim 2, further comprising:
  user-configurable control registers to store data indicative of at least one of: the first current level, the first time duration, and the second current level associated with the external transistor to be driven, wherein the control logic is configured to acquire the data from the user-configurable control registers to effect the transition from the off state to the on state.

5. The integrated circuit of claim 1, wherein the control logic is configured to:
in response to a determination that the external transistor needs to transition from the on state to the off state:
control the transistor drive circuit to sink a third current level from the input terminal of the external transistor for a second time duration; and
control the transistor drive circuit to sink a fourth current level from the input terminal of the external transistor after the second time duration;
wherein the predetermined condition includes the voltage across the output terminals of the external transistor reaching or rising above a second predetermined threshold.

6. The integrated circuit of claim 5, wherein:
the third current level and the second time duration are selected to quickly discharge a parasitic input capacitance of the external transistor before reaching a Miller plateau; and
the fourth current level is selected for use during the Miller plateau.

7. The integrated circuit of claim 5, further comprising:
user-configurable control registers to store data indicative of at least one of: the third current level, the second time duration, and the fourth current level associated with the external transistor to be driven, wherein the control logic is configured to acquire the data from the user-configurable control registers to effect the transition from the on state to the off state.

8. The integrated circuit of claim 1, wherein:
the external transistor is a high side transistor and the transistor drive circuit is a high side transistor drive circuit, the external high side transistor to be coupled in series with an external low side transistor; and
the integrated circuit further comprises:
a low side transistor drive circuit to drive an input terminal of the low side transistor, the low side transistor drive circuit having a controllable output current; and
a second voltage monitor circuit to monitor a voltage across output terminals of the low side transistor.

9. The integrated circuit of claim 8, wherein the control logic is configured to:
determine when the low side transistor needs to transition between an off state and an on state; and
in response to a determination that the low side transistor needs to transition between the off state and the on state:
control the low side transistor drive circuit to apply one current level to the input terminal of the low side transistor for a first portion of a transition period associated with the low side transistor;
control the transistor drive circuit to apply another, different current level to the input terminal of the low side transistor for a second portion of the transition period of the low side transistor; and
control the transistor drive circuit to switch from current drive to voltage drive for the low side transistor in response to the voltage across the output terminals of the low side transistor satisfying a predetermined condition.

10. The integrated circuit of claim 9, wherein:
the integrated circuit is configured to drive transistors associated with a three phase motor, wherein the transistors associated with the three phase motor include a high side transistor and a low side transistor for each of the three phases, wherein the integrated circuit includes a high side transistor drive circuit and a low side transistor drive circuit for each of the three phases, and wherein the control logic is configured to control each of the three high side drive circuits and each of the three low side drive circuits.

11. The integrated circuit of claim 1, wherein:
the integrated circuit is configured to drive at least one MOSFET having a gate terminal as an input terminal and drain and source terminals as output terminals.

12. An integrated circuit comprising:
a transistor drive circuit to drive an input terminal of an external transistor, the transistor drive circuit having a controllable output current;
control logic to control the transistor drive circuit to turn the external transistor on and off in a desired manner; and
user-configurable memory registers to store data indicative of at least one of the following: a first current level to use during a first portion of a transition period of the external transistor from an on condition to an off condition, a time duration of the first portion of the transition period from the on condition to the off condition, a second current level to use during a second portion of the transition period from the on condition to the off condition, a third current level to use during a first portion of a transition period of the external transistor from the off condition to the on condition, a time duration of the first portion of the transition period from the off condition to the on condition, and a fourth current level to use during a second portion of the transition period from the off condition to the on condition, wherein the time duration of the first portion of the transition period from the on condition to the off condition and the time duration of the first portion of the transition period from the off condition to the on condition are based, at least in part, on a start point associated with a Miller plateau effect of the external transistor;
wherein the control logic is configured to use the data stored in the user-configurable memory registers to control the transistor drive circuit.

13. The integrated circuit of claim 12, wherein:
the first current level and the first time duration are selected to quickly discharge an input capacitance of the external transistor before reaching a Miller plateau and the second current level is selected for use during the Miller plateau.

14. The integrated circuit of claim 12, wherein:
the third current level and the second time duration are selected to quickly charge the input capacitance of the external transistor before reaching a Miller plateau and the fourth current level is selected for use during the Miller plateau.

15. A method for driving a transistor, comprising:
determining whether a transistor needs to transition between an off state and an on state; and
if a determination is made that the transistor needs to transition between the off state and the on state:
applying one current level to an input terminal of the transistor for a predetermined time duration;
applying another, different current level to the input terminal of the transistor after the predetermined time duration; and
changing from a current drive to a voltage drive on the input terminal of the transistor in response to a voltage across the output terminals of the transistor satisfying a predetermined condition;

wherein the predetermined time duration is related to a start point of a Miller plateau effect of the transistor.

16. The method of claim 15, wherein:
if the determination is a determination that the transistor needs to transition from the off state to the on state:
  applying one current level includes providing a first current level to an input terminal of the transistor for a first time duration;
  applying another, different current level includes providing a second current level to the input terminal of the transistor after the first time duration; and
  the predetermined condition includes the voltage across the output terminals of the external transistor reaching or falling below a first predetermined threshold.

17. The method of claim 16, wherein:
the first current level and the first time duration are selected to quickly charge an input capacitance of the transistor before reaching a Miller plateau of the transition from the off state to the on state; and
the second current level is selected for use during the Miller plateau of the transition from the off state to the on state.

18. The method of claim 15, wherein:
if the determination is a determination that the transistor needs to transition from the on state to the off state:
  applying one current level includes drawing a third current level from the input terminal of the transistor for a second time duration;
  applying another, different current level includes drawing a fourth current level from the input terminal of the transistor after the second time duration; and
  the predetermined condition includes the voltage across the output terminals of the external transistor reaching or rising above a second predetermined threshold.

19. The method of claim 18, wherein:
the third current level and the second time duration are selected to quickly discharge the input capacitance of the transistor before reaching a Miller plateau of the transition from the on state to the off state; and
the fourth current level is selected for use during the Miller plateau of the transition from the on state to the off state.

20. The method of claim 15, further comprising:
reading data indicative of at least one of: the one current level, the other different current level, and the predetermined time duration from a memory before applying the one current level.

* * * * *

UNITED STATES PATENT AND TRADEMARK OFFICE
CERTIFICATE OF CORRECTION

PATENT NO. : 9,294,084 B1  
APPLICATION NO. : 14/554396  
DATED : March 22, 2016  
INVENTOR(S) : James McIntosh et al.

It is certified that error appears in the above-identified patent and that said Letters Patent is hereby corrected as shown below:

In the Specification

Column 3, line 52 delete "transistor, and" and replace with --transistor; and--.

Column 5, line 32 delete "embodiment." and replace with --embodiment;--.

Column 6, line 5 delete "(IS)" and replace with --(LS)--.

Column 6, line 41 delete "the IS" and replace with --the LS--.

Column 6, line 55 delete "the IS" and replace with --the LS--.

Column 9, line 14 delete "the IS" and replace with --the LS--.

Column 9, line 17 delete "the IS" and replace with --the LS--.

Column 11, line 63 delete "IHF[3.0]," and replace with --IHF1[3:0]--.

Signed and Sealed this  
Nineteenth Day of July, 2016

Michelle K. Lee  
*Director of the United States Patent and Trademark Office*